United States Patent [19]

Harth et al.

[11] 3,863,167

[45] Jan. 28, 1975

[54] PARAMETRIC MOVING FIELD AMPLIFIER

[75] Inventors: Dr. Wolfgang Harth; Jörg Müller, both of Braunschweig, Germany

[73] Assignee: Licentia Patent-Verwaltungs-G.m.b.H., Frankfurt/Main, Germany

[22] Filed: July 6, 1973

[21] Appl. No.: 377,020

[30] Foreign Application Priority Data

July 8, 1972 Germany .......... 2233726
July 8, 1972 Germany .......... 7225580

[52] U.S. Cl. .......... 330/4.6, 330/5, 330/53

[51] Int. Cl. .......... H03f 7/04

[58] Field of Search .......... 330/4.6, 4.9, 5, 53

[56] References Cited

UNITED STATES PATENTS

| | | | |
|---|---|---|---|
| 3,008,089 | 11/1961 | Uhlir | 330/4.6 |
| 3,094,671 | 6/1963 | Garrett et al. | 330/4.9 |
| 3,660,673 | 5/1972 | Anderson | 330/4.6 |

*Primary Examiner*—John Kominski
*Assistant Examiner*—Darwin R. Hostetter
*Attorney, Agent, or Firm*—Spencer & Kaye

[57] ABSTRACT

A parametric moving field amplifier comprises an amplifier with a metal insulator semiconductor structure.

8 Claims, 1 Drawing Figure

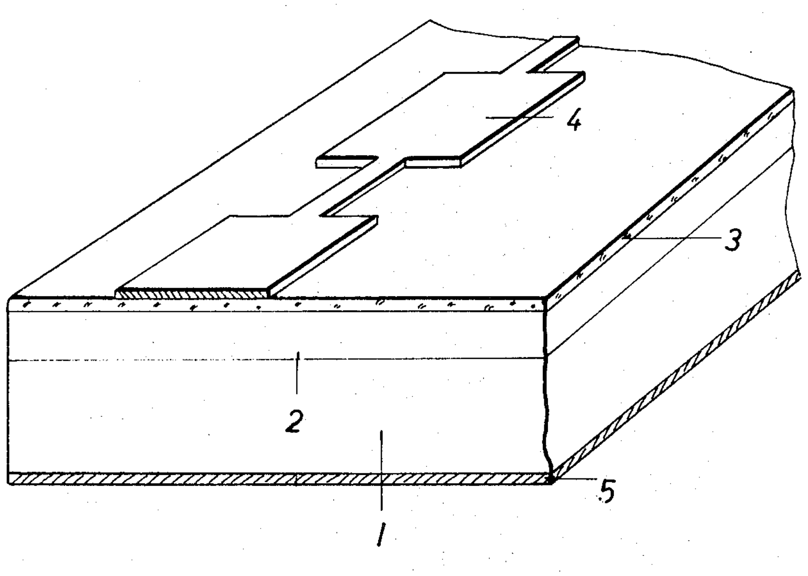
4
3
2
5
1

PARAMETRIC MOVING FIELD AMPLIFIER

BACKGROUND OF THE INVENTION

This invention relates to parametric moving field amplifiers.

SUMMARY OF THE INVENTION

It is an object of the invention to provide a parametric moving field amplifier which is suitable above all for use in integrated circuits.

According to the invention, there is provided a parametric moving field amplifier, comprising a metal insulator semiconductor structure.

BRIEF DESCRIPTION OF THE DRAWINGS

The invention will now be described in greater detail, by way of example, with reference to the drawings, the single FIGURE of which shows in perspective view and partially in section, one form of parametric moving field amplifier in accordance with the invention.

DESCRIPTION OF THE PREFERRED EMBODIMENTS

The invention proposes basically a parametric moving field amplifier which has an MIS structure. By MIS structure is understood a structure which comprises the material sequence metal, insulator and semiconductor. The metal and the semiconductor are separated from each other by an insulator or an insulating layer in a MIS structure.

Parametric moving field amplifiers according to the invention can have not only the advantage that they can be suitable for use in integrated circuits but they can also have good amplification properties and a high broad bandedness.

The metal part of the MIS structure is, in the case of the parametric moving field amplifier according to the invention, applied preferably in the form of a conductive path on the insulator. According to one form of embodiment of the invention, the width of such a conductive path is selected to be less than the width of the semiconductor or an insulating layer located on the semiconductor.

The width of the conductive path is chosen to be variable for certain applications. The conductive path in this case preferably receives a periodic structure with alternating strip width, i.e., the conductive path comprises strips which are alternately wide and narrow. A conductor constructed in such a manner has a low-pass filter characteristic. Such a low-pass filter is preferably dimensioned in such a manner that its limiting frequency is immediately above the pumping frequency of the parametric moving wave amplifier so that the sum frequency of pumping and signal frequency is no longer capable of being extended.

In the case of the parametric moving field amplifier according to the invention an electrical contact is applied to the semiconductor. This is effected preferably on the side of the semiconductor opposite the insulating layer.

The semiconductor of the MIS structure has, for example, a specific resistance of between $5.10^{-2}$ and $5.10^{-1}$ Ohmcm. The insulator is, for example, 0.05 to 0.2/um thick. The width of the conductive path located on the insulating layer is selected for example between 10 and 50/um. The semiconductor preferably comprises silicon. As material for the insulating layer for example $SiO_2$, $Si_3N_4$, $Al_2O_3$ are suitable and double layers of $SiO_2$ and $Si_3N_4$or $Al_2O_3$ are also suitable.

Referring now to the drawing, a parametric moving field amplifier with an MIS structure according to the invention is shown. The semiconductor in this exemplary embodiment comprises a substrate 1 and an epitaxial layer 2 located on the substrate. The substrate has, for example, a thickness of $10^{-2}$ cm, whereas the thickness of the epitaxial layer amounts to $10^{-4}$ cm, for example. According to the drawing, an insulating layer 3 is applied to the epitaxial layer 2. The thickness of this insulating layer 3 is for example $10^{-5}$ cm. A conductive path 4 is located, as the metal part of the MIS structure, on the insulating layer 3. As the exemplary embodiment shows, the conductive path 4 has a smaller width than the semiconductor body comprising the substrate and the epitaxial layer or the insulating layer located thereabove. The conductive path 4 changes periodically between wide and narrow strips. The strip width of the wide strip is, for example, 50/um and that of the narrow strips, for example, 10/um. For contacting the semiconductor body a metal electrode 5, which in the exemplary embodiment contacts the entire underside of the semiconductor body, is applied to the underside of the substrate 1.

It will be understood that the above description of the present invention is susceptible to various modification changes and adaptations.

What we claim:

1. A parametric moving field amplifier comprising in combination:

a semiconductor body;

a layer of insulating material on one surface of said semiconductor body;

a striplike metal conductor on the surface of said insulating layer and extending along the length thereof, said conductor having a width which is less than the width of said insulating layer and of said semiconductor body, said width of said conductor varying along the length of said conductor and having a periodic structure with different strip widths, said periodic structure being dimensioned to form a low pass filter with the limiting frequency of the filter being immediately above the pumping frequency of the amplifier; and an electrical contact applied to the surface of said semiconductor body opposite to said one surface.

2. An amplifier as defined in claim 1, wherein said semiconductor has a specific resistance between $5.10^{-2}$ and $5.10^{-1}$ Ohmcm.

3. An amplifier as defined in claim 2, wherein said insulating layer has a thickness of between 500 and 2000 A.

4. An amplifier as defined in claim 3, wherein said conductive path has a width of between 10 and 50/um.

5. An amplifier as defined in claim 1, wherein said semiconductor comprises silicon.

6. An amplifier as defined in claim 5, wherein said insulator consists of one of the group consisting of $SiO_2$, $Si_3N_4$, $Al_2O_3$.

7. An amplifier as defined in claim 5, wherein said insulator comprises double layers of $SiO_2$ and $Si_3N_4$.

8. An amplifier as defined in claim 5, wherein said insulator comprises double layers of $SiO_2$ and $Al_2O_3$.

* * * * *